(12) United States Patent
Dias et al.

(10) Patent No.: US 10,164,115 B2
(45) Date of Patent: Dec. 25, 2018

(54) NON-LINEAR FIN-BASED DEVICES

(71) Applicant: Intel Corporation, Santa Clara, CA (US)

(72) Inventors: Neville L. Dias, Hillsboro, OR (US); Chia-Hong Jan, Portland, OR (US); Walid M. Hafez, Portland, OR (US); Roman W. Olac-Vaw, Hillsboro, OR (US); Hsu-Yu Chang, Hillsboro, OR (US); Ting Chang, Hillsboro, OR (US); Rahul Ramaswamy, Hillsboro, OR (US); Pei-Chi Liu, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/127,850

(22) PCT Filed: Jun. 27, 2014

(86) PCT No.: PCT/US2014/044479
§ 371 (c)(1),
(2) Date: Sep. 21, 2016

(87) PCT Pub. No.: WO2015/199709
PCT Pub. Date: Dec. 30, 2015

(65) Prior Publication Data
US 2017/0098709 A1 Apr. 6, 2017

(51) Int. Cl.
H01L 29/78 (2006.01)
H03D 7/14 (2006.01)
(Continued)

(52) U.S. Cl.
CPC .. H01L 29/7853 (2013.01); H01L 21/823412 (2013.01); H01L 21/823431 (2013.01);
(Continued)

(58) Field of Classification Search
CPC .. G06G 7/00; G06G 7/06; G06G 7/14; G06G 7/26; G06J 1/00; G06N 3/00;
(Continued)

(56) References Cited

U.S. PATENT DOCUMENTS

2005/0073060 A1 4/2005 Datta et al.
2007/0001219 A1 1/2007 Radosavljevic et al.
(Continued)

FOREIGN PATENT DOCUMENTS

EP 2560209 A1 2/2013
JP H0346361 A1 2/1991
(Continued)

OTHER PUBLICATIONS

International Searching Authority, "Notification of Transmittal of the International Search Report and the Written Opinion of the International Searching Authority," dated Mar. 26, 2015, in International application No. PCT/US2014/044479.
(Continued)

*Primary Examiner* — Lincoln Donovan
*Assistant Examiner* — David Mattison
(74) *Attorney, Agent, or Firm* — Trop, Pruner & Hu, P.C.

(57) ABSTRACT

An embodiment includes an apparatus comprising: a non-planar fin having first, second, and third portions each having major and minor axes and each being monolithic with each other; wherein (a) the major axes of the first, second, and third portions are parallel with each other, (b) the major axes of the first and second portions are non-collinear with each other, (c) each of the first, second, and third portions include a node of a transistor selected from the group comprising source, drain, and channel, (e) the first, second, and third portions comprise at least one finFET. Other embodiments are described herein.

22 Claims, 7 Drawing Sheets

(51) Int. Cl.
*H01L 21/8234* (2006.01)
*H01L 27/088* (2006.01)
*H01L 29/06* (2006.01)
*H01L 29/08* (2006.01)
*H01L 29/10* (2006.01)
*H01L 21/84* (2006.01)
*H01L 27/12* (2006.01)
*H03D 7/16* (2006.01)
*H01L 29/417* (2006.01)

(52) U.S. Cl.
CPC ........ *H01L 21/845* (2013.01); *H01L 27/0886* (2013.01); *H01L 27/1211* (2013.01); *H01L 29/0657* (2013.01); *H01L 29/0847* (2013.01); *H01L 29/1033* (2013.01); *H03D 7/1425* (2013.01); *H03D 7/1441* (2013.01); *H03D 7/1458* (2013.01); *H03D 7/1466* (2013.01); *H03D 7/165* (2013.01); *H01L 29/41791* (2013.01)

(58) Field of Classification Search
CPC ... G06N 3/0635; H01L 21/00; H01L 21/8234; H01L 21/823412; H01L 21/823431; H01L 27/00; H01L 27/088; H01L 27/0886; H01L 29/00; H01L 29/06; H01L 29/0657; H01L 29/0847; H01L 29/10; H01L 29/1033; H01L 29/78; H01L 29/7853; H03D 7/00; H03D 7/14; H03D 7/1441
USPC .......................................................... 327/361
See application file for complete search history.

(56) References Cited

U.S. PATENT DOCUMENTS

| | | |
|---|---|---|
| 2007/0262793 A1 | 11/2007 | Kapoor |
| 2008/0135888 A1 | 6/2008 | Lee et al. |
| 2010/0187575 A1 | 7/2010 | Baumgartner et al. |
| 2011/0079829 A1 | 4/2011 | Lai et al. |
| 2011/0204419 A1 | 8/2011 | Johnson et al. |
| 2012/0199918 A1 | 8/2012 | Pham |
| 2013/0043536 A1 | 2/2013 | Rahim et al. |
| 2013/0075811 A1 | 3/2013 | Wang et al. |
| 2013/0214332 A1 | 8/2013 | Wu |
| 2013/0221448 A1 | 8/2013 | Chang et al. |
| 2013/0270559 A1 | 10/2013 | Hafez et al. |
| 2014/0167264 A1* | 6/2014 | Besser ................ H01L 29/4916 257/741 |
| 2015/0001630 A1* | 1/2015 | Singh ................ H01L 29/66795 257/369 |
| 2015/0214367 A1* | 7/2015 | Chang ............... H01L 21/76897 257/401 |
| 2017/0025533 A1* | 1/2017 | Phoa ............... H01L 21/823412 |

FOREIGN PATENT DOCUMENTS

| | | |
|---|---|---|
| JP | 2008117816 A | 5/2008 |
| KR | 1020050102465 | 10/2005 |
| KR | 1020110041645 | 4/2011 |

OTHER PUBLICATIONS

European Patent Office, Extended European Search Report dated Jan. 24, 2018 in European Patent Application No. 14896226.9.
Japanese Patent Office, Notification of Reasons for Refusal as dated Mar. 20, 2018 in Japanese Patent Application No. 2016-568876.

\* cited by examiner

NON-LINEAR FIN-BASED DEVICES

TECHNICAL FIELD

Embodiments of the invention are in the field of semiconductor devices and, in particular, non-planar transistors.

BACKGROUND

A finFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a finFET is typically referred to as a "tri-gate" finFET. Other types of finFETs exist (such as "double-gate" finFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
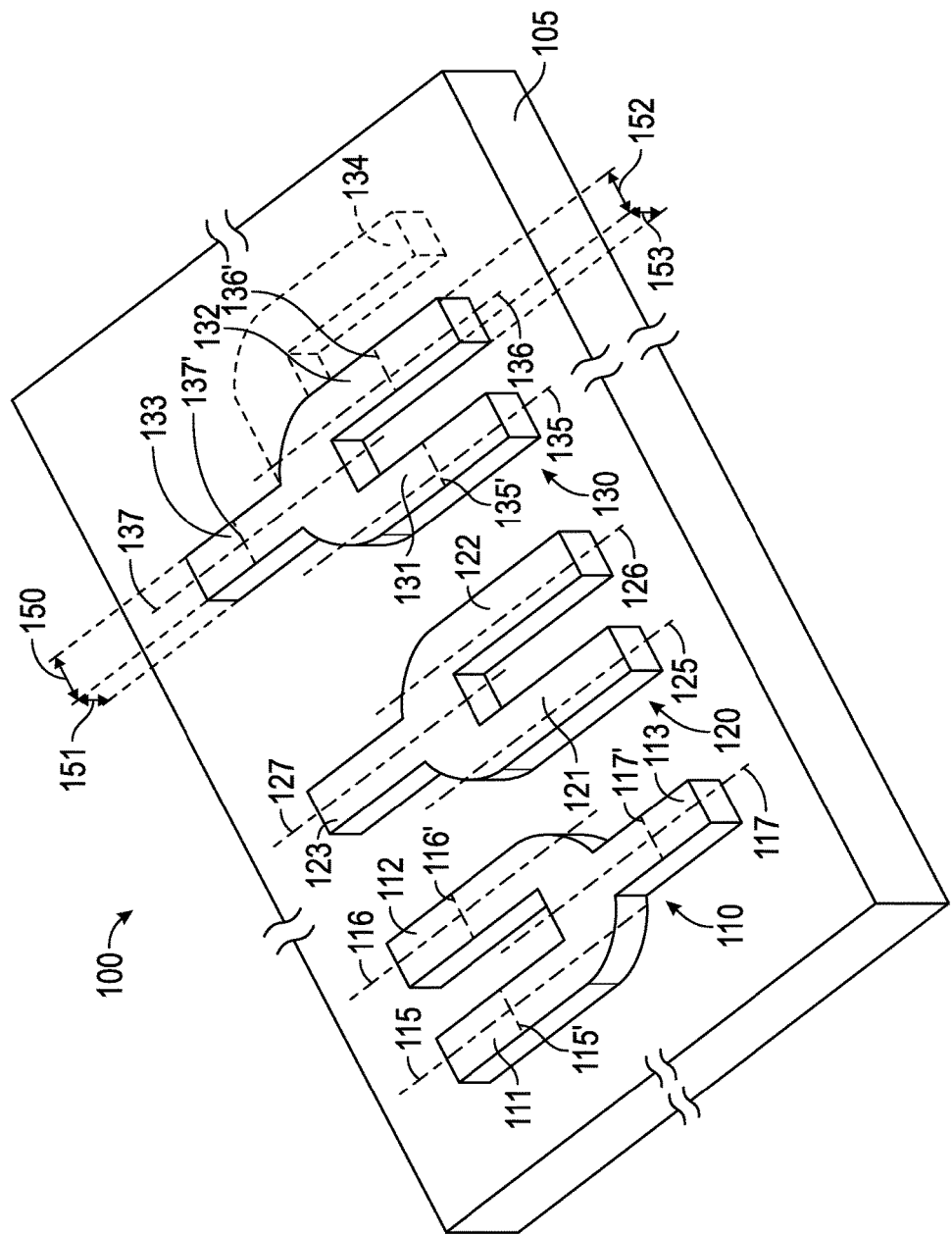
FIG. 1 includes multiple non-linear fin-based finFETs in an embodiment of the invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

An embodiment includes a multi-terminal finFET transistor (e.g., a three terminal finFET) manufactured using a process that is based on self-aligned spacers and a non-linear "bent" backbone architecture. Such transistors are sometimes referred to herein as non-linear fin-based finFETs because the fins upon which they are formed may be non-linear. A non-linear fin-based structure may be used to form a mixer to convert a first frequency input to a second frequency output. By varying the shape of the backbone structure, multiple non-linear fin-based finFETs may be located side by side one another in a parallel or antiparallel (also referred to as antipodal) manner.

An embodiment includes a non-linear fin-based finFET mixer having three terminals. One terminal is used for a high frequency input signal, a second terminal is used to input a local oscillator frequency, and a third terminal is used to output a mixed signal that is a mixture of the high frequency input signal and the local oscillator frequency.

An embodiment includes non-linear fin-based finFETs arranged in a cascoded manner, which then allows for multiple input and multiple output (MIMO) communication on a single system-on-chip (SoC). MIMO relates to the use of multiple antennas at both the transmitter and receiver of a radio system to improve communication performance.

FIG. 1 includes multiple non-linear fin-based finFETs in an embodiment of the invention. More specifically, the apparatus of FIG. 1 includes a SoC 100 with parallel finFETs 120, 130 and a finFET 110 that is anti-parallel to finFET 120. SoC 100 comprises a non-planar fin 110 having first portion 111, second portion 112, and third portion 113. Portion 110 includes major axis 115 and minor axis 115'. Portion 112 includes major axis 116 and minor axis 116'. Portion 113 includes major axis 117 and minor axis 117'. Portions 111, 112, 113 are each monolithic with each other. For example, the portions 111, 112, 113 are all formed from the same original fin and are not coupled together by means of traces or interconnects but instead are formed from the same fin structure.

SoC 100 comprises a non-planar fin 120 having first portion 121, second portion 122, and third portion 123. Portion 120 includes major axis 125, portion 122 includes major axis 126, and portion 123 includes major axis 127. Portions 121, 122, 123 are each monolithic with each other. Fin 110 is not monolithic with fin 120. While they have shared a common fin at some point in the SoC manufacturing process the stage of the process shown in FIG. 1 shows fins 110, 120 as not being monolithic with each other.

SoC 100 comprises a non-planar fin 130 having first portion 131, second portion 132, and third portion 133. Portion 130 includes major axis 135 and minor axis 135'. Portion 132 includes major axis 136 and minor axis 136'. Portion 133 includes major axis 137 and minor axis 137'. Portions 131, 132, 133 are each monolithic with each other.

Fin 110 is representative of fins 110, 120, 130. In fin 110 major axes 115, 116, 117 are parallel with each other and major axes 115, 116, 117 are non-collinear with each other.

Figure 2A:
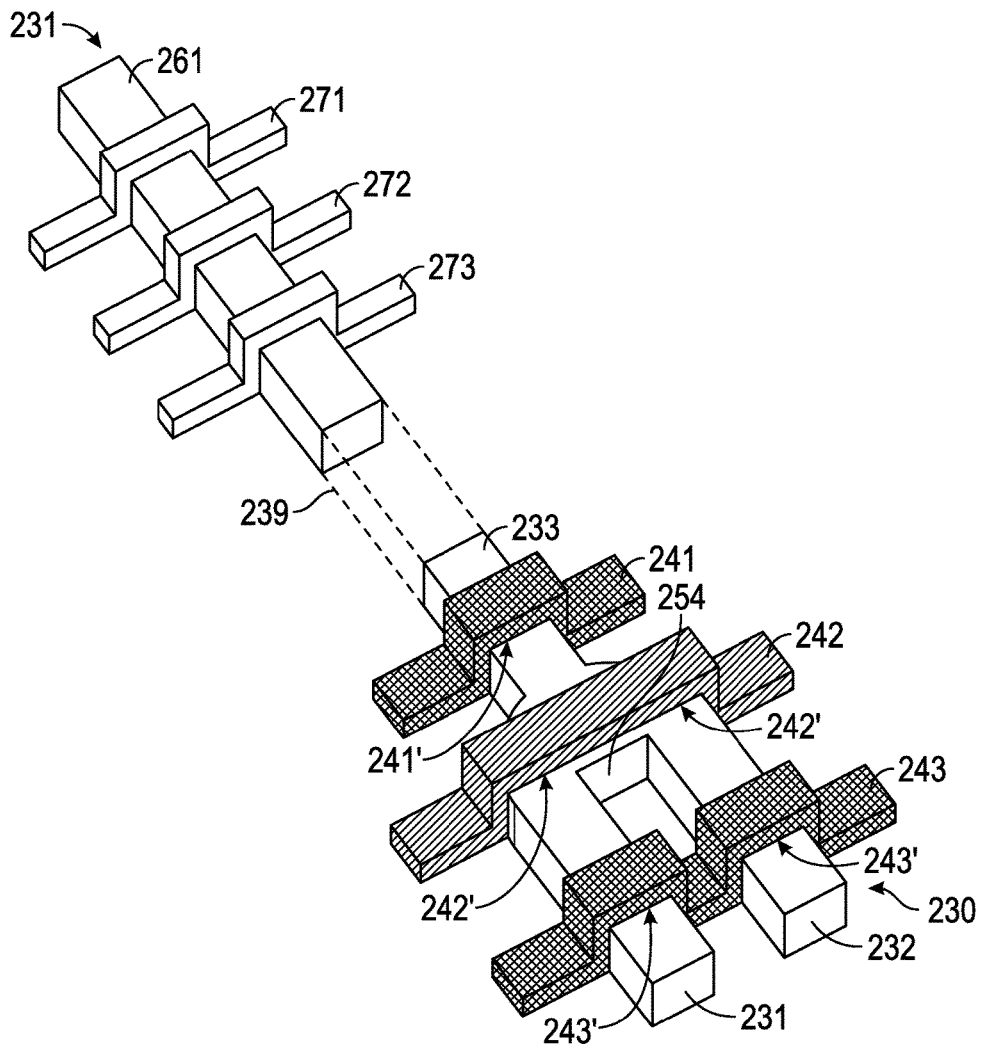
FIG. 2(a) includes a linear fin-based finFET and a non-linear fin-based finFET in an embodiment of the invention.

FIG. 2(a) includes a linear fin-based finFET and a non-linear fin-based finFET in an embodiment of the invention.

Figure 2B:
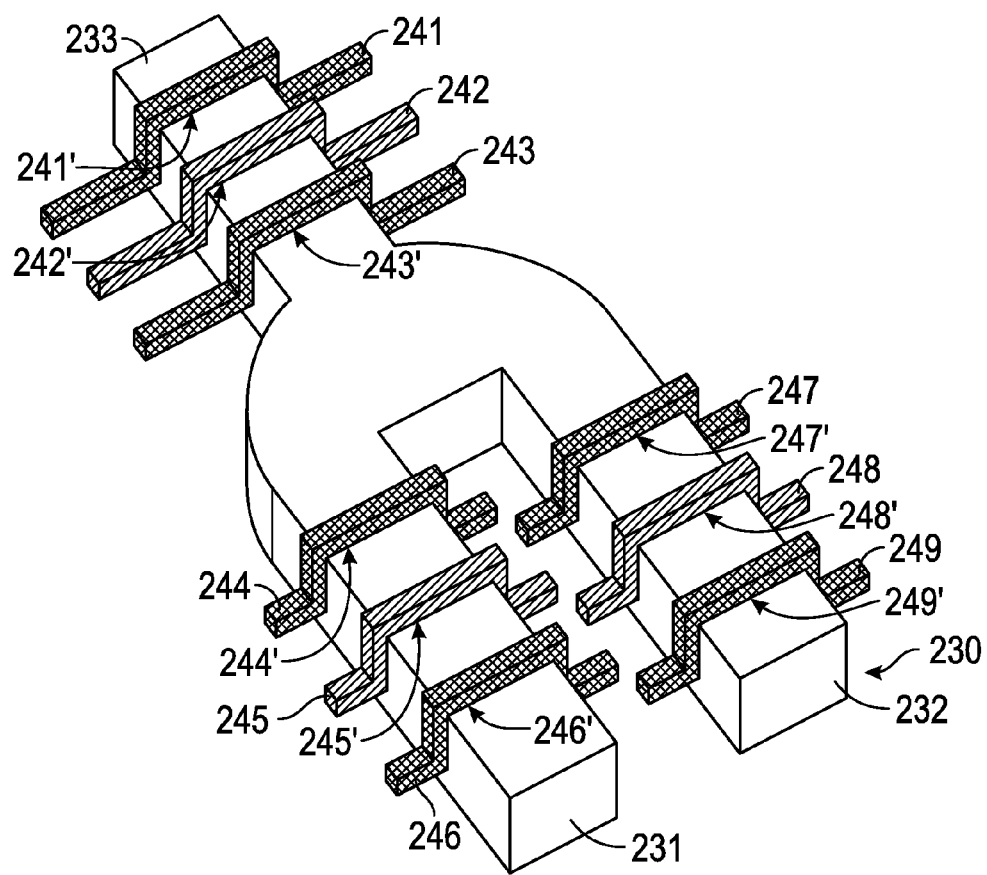
FIG. 2(b) includes a non-linear fin-based finFET in an embodiment of the invention.

FIG. 2(b) includes a non-linear fin-based finFET in an embodiment of the invention. Both of FIGS. 2(a) and 2(b) include a fin having portions 231, 232, 233 and each of the portions 231, 232, 233 include a node of a transistor selected from the group comprising source, drain, and channel. The portions 231, 232, 233 collectively comprise at least one finFET.

In FIG. 2(a) each of the portions 231, 232, 233 includes a node of a single finFET. The portions 231, 232, 233 intersect with each other at a common portion 254 that includes a channel for the single finFET 230. Contact 243 is on source portions 243' of the fin, contact 242 is on channel portion 242' of the fin, and contact 241 is on drain portion 241' of the fin.

FIG. 2(b) differs from the embodiment of FIG. 2(a) in that in the embodiment of FIG. 2(b) each of the portions 231, 232, 233 includes a finFET having source, drain, and channel nodes. Thus, the fin 230 includes three finFETs. Specifically, a first finFET contact 243 is on source portion 243' of the fin, contact 242 is on channel portion 242' of the fin, and contact 241 is on drain portion 241' of the fin portion 233. For a second finFET contact 246 is on source portion 246' of the fin, contact 245 is on channel portion 245' of the fin, and contact 244 is on drain portion 244' of the fin portion 231. For a third finFET contact 249 is on source portion 249' of the fin, contact 248 is on channel portion 248' of the fin, and contact 247 is on drain portion 247' of the fin portion 232. Thus, portions 231, 232 each include a channel (245', 248'). In one embodiment the channels 245', 248' are coupled to a single common gate contact (not shown), the channels 245', 248' not directly contacting each other. In another embodiment the channels 245', 248' are coupled to differing gate contacts, the channels 245', 248' not directly contacting each other. Also, in an embodiment portions 231, 232 each include a source (246', 249'). In one embodiment sources 246', 249' are coupled to a single common source contact (not shown), the sources for the first and second portions not directly contacting each other. In one embodiment sources 246', 249' are coupled to differing source contacts, the sources 246', 249' not directly contacting each other. In one embodiment drains 244', 247' are coupled to a single common source contact (not shown), the drains for the first and second portions not directly contacting each other. In one embodiment drains 244', 247' are coupled to differing drain contacts, the drains 246', 249' not directly contacting each other.

Returning to FIG. 2(a), fin portions 231, 232, 233 of non-linear fin 230 may be included on a SoC that includes a conventional linear fin-based finFET 231 that is based on linear fin 261. The conventional linear fin-based finFET 231 may include a non-planar fin 261 that is not monolithic with the non-planar fin 230. As indicated by dashed lines 239 the fin portion 261 may have aligned with portion 233 at one time during the manufacturing process only to be separated at a later point in the process. The removed fin portion may be replaced with interlayer dielectric (ILD) and the like to isolate fin 261 from fin 230. As will be explained below, embodiments of the self-aligned spacer technique are fully compatible with forming both linear fin-based finFETs on the same substrate/SoC as non-linear fin-based finFETs. Linear fin-based finFETs and non-linear fin-based finFETs may be formed from the same fin. Thus, conventional two terminal devices and three terminal devices can be manufactured on the same die by choice of the backbone structure (e.g., linear vs. nonOlinear), making process embodiments highly versatile.

Please note that while embodiments, such as that of FIG. 2(a), show a source portion on a side of the fin having more members than the drain side (e.g., device 230 has two members 231, 232 on one side and one member 233 on another side), the nodes are interchangeable and element 243' could denote a drain and element 241' could denote a source in other embodiments.

Returning to FIG. 1, any of fins 110, 111, 112 may be fashioned as either fin 230 of FIG. 2(a) or fin 230 of FIG. 2(b). Fin 110 is immediately adjacent and anti-parallel/antipodal to fin 120, which is immediately adjacent and parallel to fin 130. All of fins 110, 120, 130 are formed on substrate 105 and included in SoC 100. None of fins 110, 120, 130 are monolithic with each other.

Taking fin 130 as being representative of fins 110, 120, 130, portion 133 has maximum width 150 and maximum height 151 and portion 132 has maximum width 152 and maximum height 153. Height 151 may be unequal to height 153 and/or width 150 may be unequal to width 152. As a result, an embodiment may provide benefits for short channel control by varying widths of different portion of a fin. For example, a channel and/or drain portion may be thicker than a source portion to better manage short channel effects.

Figure 3:
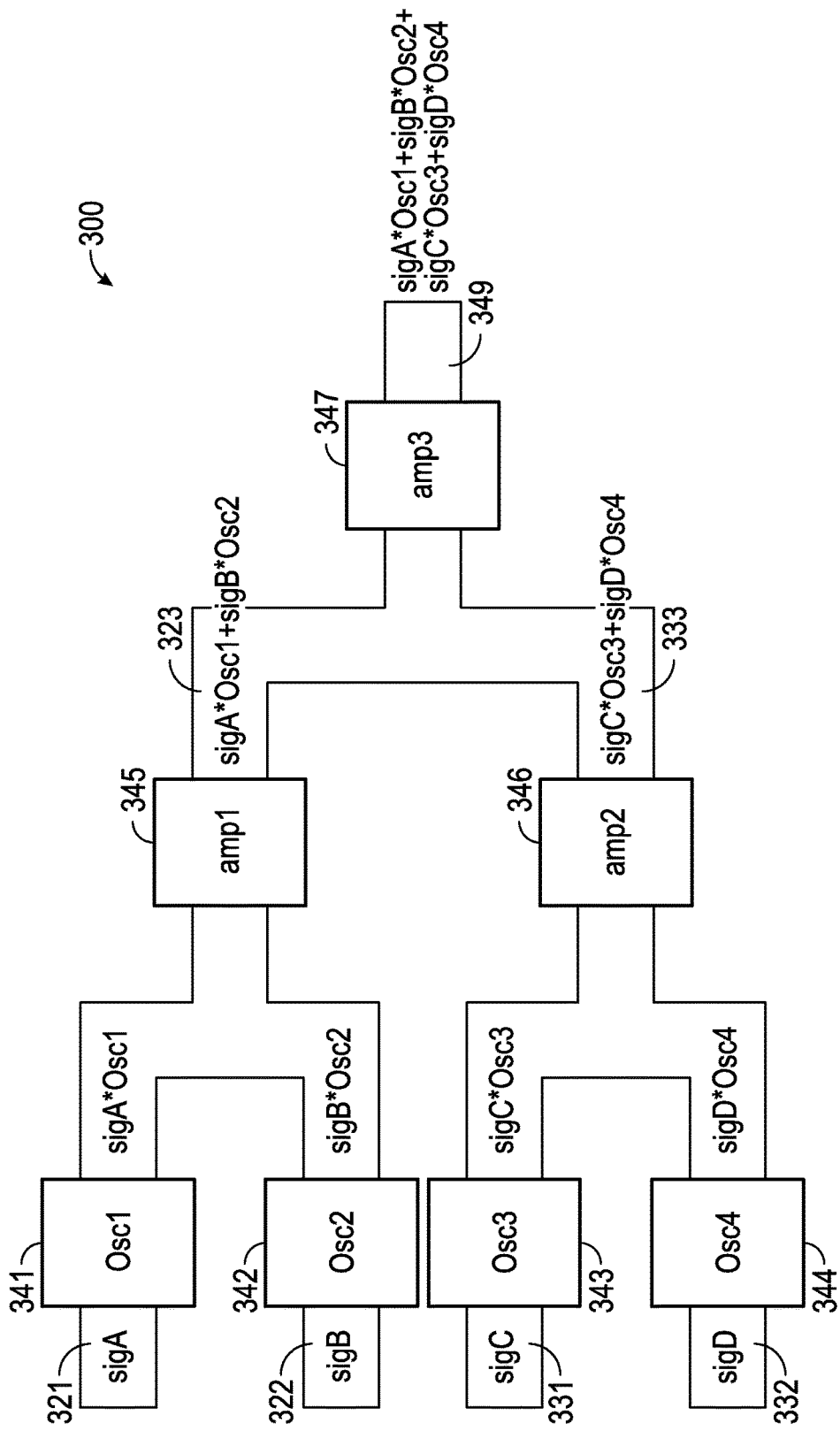
FIG. 3 includes a mixer and amplifier in an embodiment of the invention.

FIG. 3 includes a mixer in an embodiment of the invention. In electronics a mixer or frequency mixer may be a nonlinear electrical circuit that creates new frequencies from two signals applied to it. For example, two signals at frequencies f1 and f2 are applied to a mixer, and the mixer produces new signals at the sum f1+f2 and difference f1−f2 of the original frequencies. Other frequency components may also be produced in a frequency mixer.

SoC 300 comprises a non-planar fin having portions 321, 322, 323, 331, 332, 333, 349, all of which are monolithic with one another (formed from a single contiguous fin). SoC 300 may include a RF mixer.

Portion 321 includes input nodes for a first signal and an oscillator signal and an output node for mixed signal based on the first signal and the oscillator signal. For example, portion 321 includes an input node (e.g., source node) for signal sigA and another input node (e.g., gate node) for local oscillator signal Osc1. Portion 321 includes an output node (e.g., drain node) for outputting mixed signal sigA*Osc1. Thus, portion 321 constitutes a mixer by itself. However, in the embodiment of FIG. 3 the mixer of portion 321 may be combined with other mixers as follows. Portion 322 includes an input node (e.g., source node) for signal sigB, input node (e.g., gate node) for local oscillator signal Osc2, and output node (e.g., drain node) for outputting mixed signal sigB*Osc2. Portion 331 includes an input node (e.g., source node) for signal sigC, input node (e.g., gate node) for local oscillator signal Osc3, and output node (e.g., drain node) for outputting mixed signal sigC*Osc3. Portion 332 includes an input node (e.g., source node) for signal sigD, input node (e.g., gate node) for local oscillator signal Osc4, and output node (e.g., drain node) for outputting mixed signal sigD*Osc4.

Portion 321 includes the output node for sigA*Osc1 as well as an input node for another portion of SoC 300. For example, portion 323 includes an input node (e.g., source node) for signals sigA*Osc1 and sigB*Osc2, input node (e.g., gate node) for a gate signal amp1, and an output node (e.g., drain node) for outputting amplified signal sigA*Osc1+sigB*Osc2. Thus, portion 323 is included in a transistor amplifier, such as a transconductance amplifier FET. Such a device may be included in a cascode configuration.

Portion 333 includes an input node (e.g., source node) for mixed signals sigC*Osc3 and sigD*Osc4, input node (e.g., gate node) for a gate signal amp2, and output node (e.g., drain node) for outputting amplified signal sigC*Osc3+ sigD*Osc4. Thus, portion 333 is included in a transistor amplifier, such as a transconductance amplifier FET. Such a device may be included in a cascode configuration.

Portion 349 includes an input node (e.g., source node) for mixed and amplified signals sigA*Osc1+sigB*Osc2 and sigC*Osc3+sigD*Osc4, input node (e.g., gate node) for a gate signal amp3, and output node (e.g., drain node) for outputting mixed and amplified signal sigA*Osc1+ sigB*Osc2+sigC*Osc3+sigD*Osc4. Thus, portion 349 is included in a transistor amplifier, such as a transconductance amplifier FET. Such a device may be included in a cascode configuration.

In an embodiment, inputs for signals such as sigA and sigB may be used to receive signals from dual antennae in a MIMO system.

While embodiments show oscillator signals typically driving a gate of a finFET in other embodiments the oscillator signal or any other input signal may be input at another node. For example, sigA could be input as shown in FIG. 3 but the oscillator signal could be input where sigB is shown allowing sigA and Osc1 to be mixed before reaching the gate driving by amp1.

Figure 4:
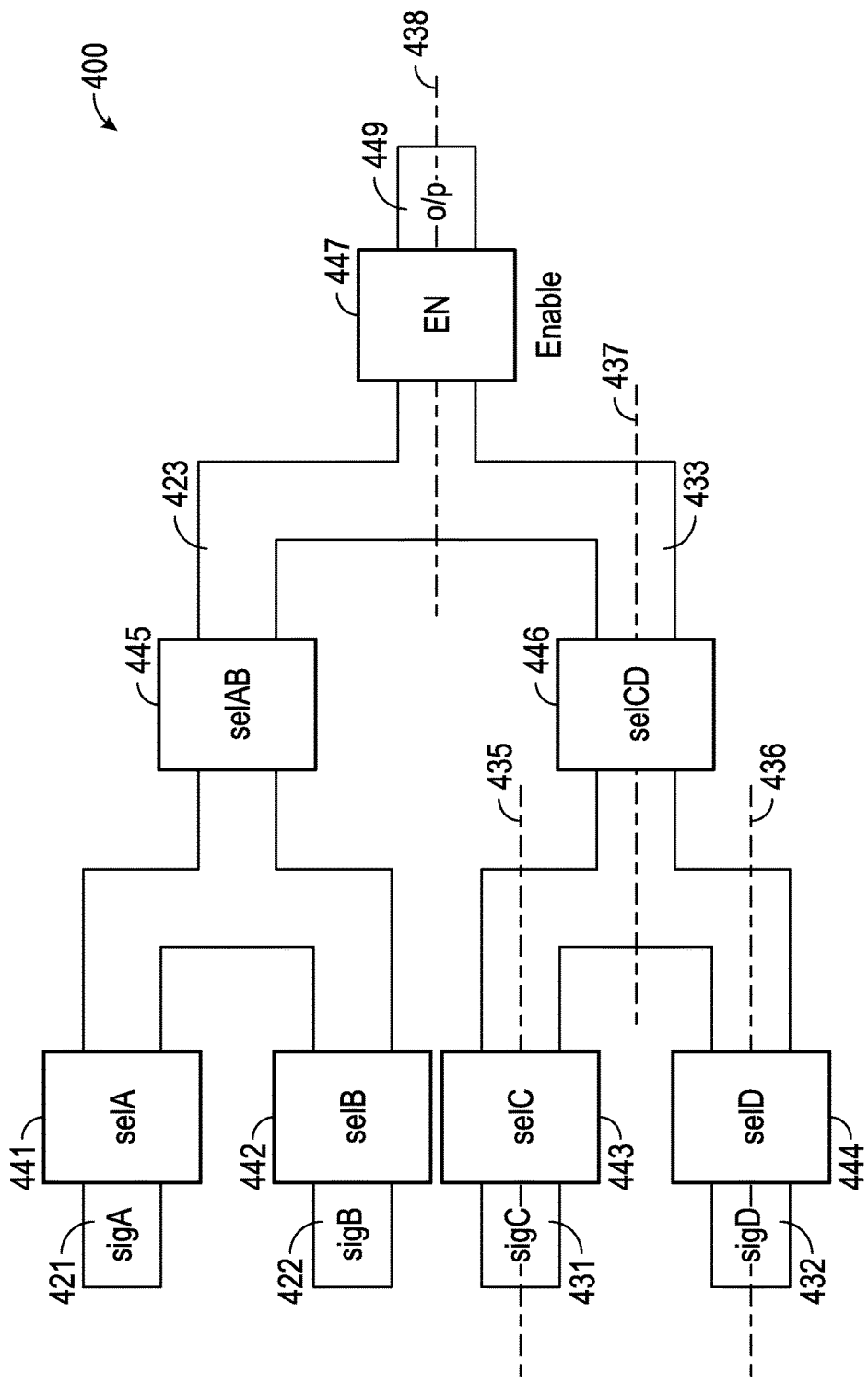
FIG. 4 includes a multiplexor (mux) in an embodiment of the invention.

FIG. 4 includes a multiplexor (mux) in an embodiment of the invention. A mux is a device that selects one of several analog or digital input signals and forwards the selected input into a single line. A multiplexer of $2^n$ inputs has n select lines, which are used to select which input line to send to the output. Multiplexers are mainly used to increase the amount of data that can be sent over a network within a certain amount of time and bandwidth. A multiplexer is also called a data selector.

SoC 400 comprises a non-planar fin having portions 421, 422, 423, 431, 432, 433, 449, all of which are monolithic with one another (formed from a single contiguous fin). SoC 400 may include a mux.

Portion 431 includes major axis 435. Portion 432 includes major axis 436. Portion 433 includes major axis 437. Portion 449 includes major axis 438. Axes 435, 4365, 437, 438 are parallel with each other. Axis 438 is non-collinear with axes 435, 436, 437 although this need not be the case in all embodiments.

Portion 421 includes an input node (e.g., source) for signal sigA, portion 422 includes an input node (e.g., source) for signal sigB, portion 423 includes an output node for one of sigA and sigB, and portions 421, 422 include selection nodes (e.g., gate) selA 441 and selB 442. Selection nodes 441, 442 may be coupled to a single contact but one of those nodes may include an inverter and the like so a single Hi signal selects one of sigA, sigB and deselects the other of sigA, sigB and the a single Lo signal selects another of sigA, sigB and deselects the other of sigA, sigB.

Portions 421, 422 constitute a 2:1 mux, which may be coupled to other portions of SoC 400. For example, the entirety of SoC 400 forms a 4:1 mux. Portion 431 includes an input node (e.g., source) for signal sigC, portion 432 includes an input node (e.g., source) for signal sigD, portion 433 includes an output node for one of sigC and sigD, and portions 431, 432 include selection nodes (e.g., gate) selC 443 and selB 442.

Portion 423 includes an input node (e.g., source) for one of signals sigA, sigB, portion 433 includes an input node (e.g., source) for one of signal sigC, sigD, portion 449 includes an output node for one of signals sigA, sigB, sigC, sigD, and portions 423, 433 include selection nodes (e.g., gate) selAB 445 (to select one of sigA and sigB or none of sigA and sigB) and selCD 446 (to select one of sigC and sigD or none of sigC and sigD). Portion 449 may further include an enable EN input to select a Hi or Lo setting.

The signal to selA, selB, seIC, selD may include signal s0 and the signal to selAB and selCD may include signal s1 to generate a typical 4:1 mux having a conventional 4:1 truth table for a mux having an EN input.

Figure 5C:
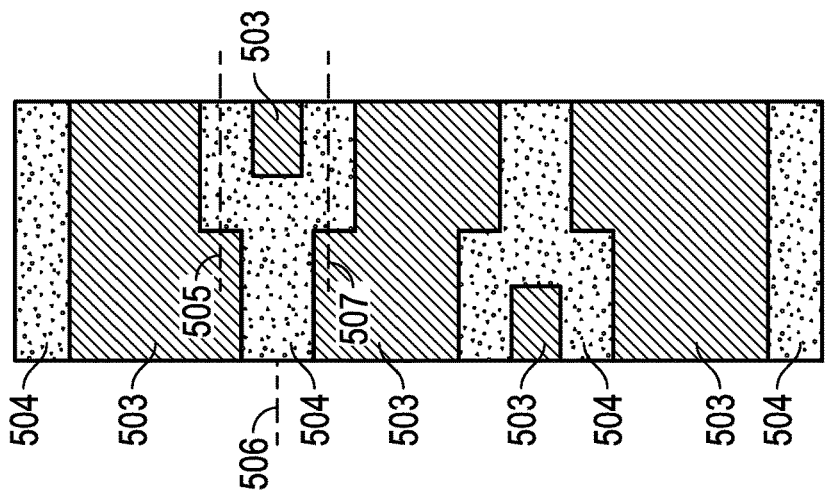
FIGS. 5(a)-(c) include a method for forming non-linear fin-based finFETs in an embodiment of the invention.
Figure 5B:
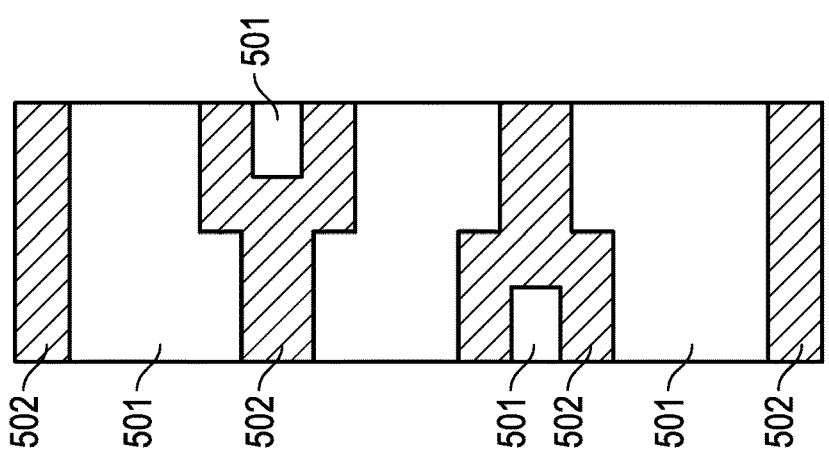
Figure 5A:
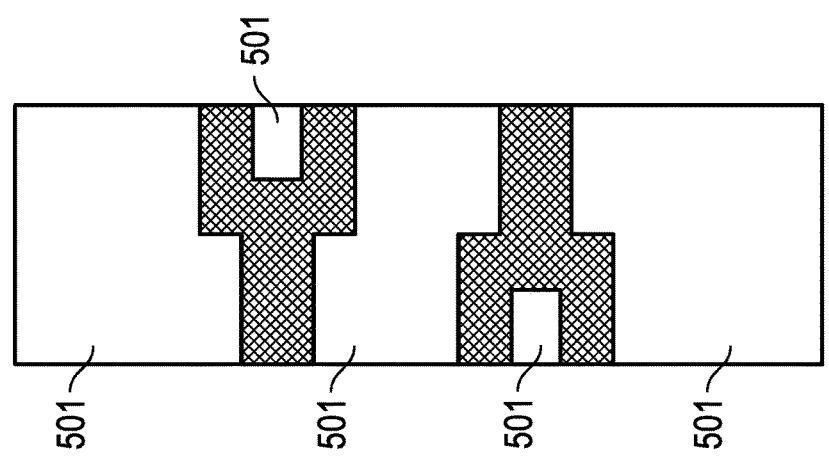
Figure 6:
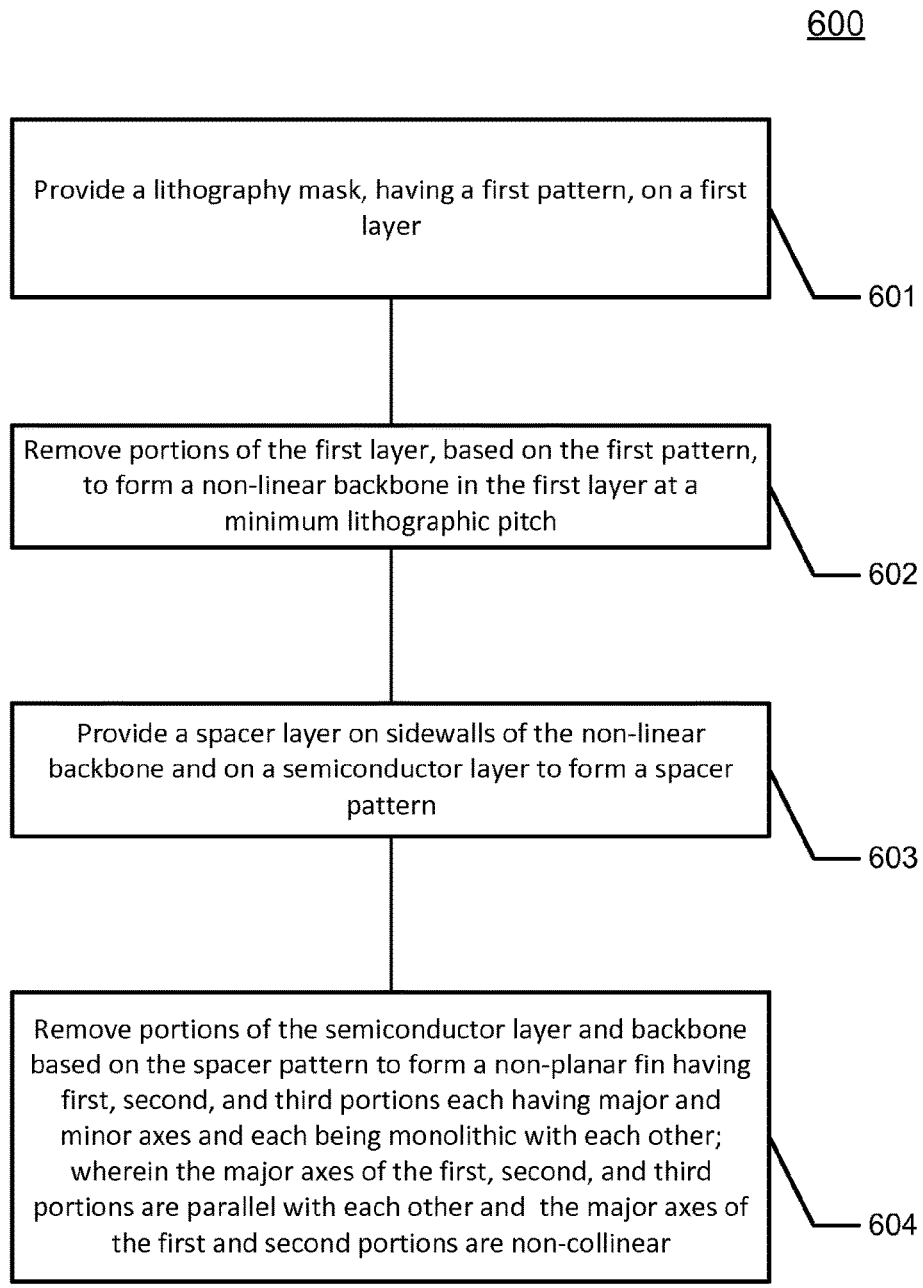
FIG. 6 includes a schematic flow chart for the method of FIGS. 5(a)-(c).

FIGS. 5(a)-(c) include a method for forming non-linear fin-based finFETs in an embodiment of the invention. FIG. 6 includes a schematic flow chart for the method of FIGS. 5(a)-(c).

Block 601 includes providing a lithography mask, having a first pattern, on a first layer. The first layer may include photoresist, oxide, and the like. Block 602 includes removing portions of the first layer, based on the first pattern, to form a non-linear backbone (see FIG. 5(a) backbone 501) in the first layer at a minimum lithographic pitch (although not all embodiments require minimum pitch). Block 603 includes providing a spacer layer on sidewalls of the non-linear backbone and on a semiconductive layer to form a spacer pattern (see FIG. 5(b) spacer layer 502).

A spacer is a film layer formed on the sidewall of a pre-patterned feature. A spacer is formed by deposition or reaction of film on the previous pattern, followed by etching/removing the film material on the horizontal surfaces, leaving only the material on the sidewalls. By removing the original patterned feature, only the spacer is left. However, since there are two spacers for every line, the line density has now doubled. The spacer technique is applicable for defining narrow gates at half the original lithographic pitch, for example. The spacer approach is unique in that with one lithographic exposure, the pitch can be halved indefinitely with a succession of spacer formation and pattern transfer processes. This conveniently avoids the serious issue of overlay between successive exposures. As spacer materials may include hardmask materials, their post-etch pattern quality may be superior compared to photoresist profiles after etch, which are generally plagued by line edge roughness.

Block 604 includes removing portions of the backbone and semiconductive layer based on the spacer pattern to form a non-planar fin (see FIG. 5(c) fins 504 on semiconductor 503) having first, second, and third portions each having major axes and each being monolithic with each other; wherein the major axes 505, 506, 507 of the first, second, and third portions are parallel with each other and the major axes 505, 506, 507 are non-collinear with each other.

Thus, as shown with method 600, use of a backbone structure and self-aligned spacer techniques yields highly uniform fin dimensions compared to similar structures created by direct lithography. The pitch for the fin 504 portions of FIG. 5(c) may be ½ or less than the minimum lithography pitch of FIG. 5(a). An embodiment includes creating a backbone structure by direct lithography, depositing a spacer, etching away/removing backbone structure, and then transferring the spacer pattern to a substrate to create fins.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes an apparatus comprising: a non-planar fin having first, second, and third portions each having major and minor axes and each being monolithic with each other; wherein (a) the major axes of the first, second, and third portions are parallel with each other, (b) the major axes of the first and second portions are non-collinear with each other, (c) each of the first, second, and third portions include a node of a transistor selected from the group comprising source, drain, and channel, (e) the first, second, and third portions comprise at least one finFET.

In example 2 the subject matter of the Example 1 can optionally include wherein each of the first, second, and third portions includes a finFET having source, drain, and channel nodes, the fin included in at least three finFETs.

In example 3 the subject matter of the Examples 1-2 can optionally include wherein each of the first, second, and third portions includes a node of a single finFET.

In example 4 the subject matter of the Examples 1-3 can optionally include wherein the first, second, and third portions intersect with each other at a common portion that includes a channel for the single finFET.

In example 5 the subject matter of the Examples 1-4 can optionally include The apparatus of claim 1 wherein (a) the fin includes a fourth portion having major and minor axes and being monolithic with the first, second, and third portions, (b) the major axes of the first, second, third, and fourth portions are parallel with each other, (c) the major axis of the fourth portion is non-collinear with at least one of the major axes of the first, second, and third portions.

In example 6 the subject matter of the Examples 1-5 can optionally include an additional non-planar fin having additional first, second, and third portions each having additional major and minor axes and each being monolithic with each other; wherein (a) the additional major axes of the first, second, and third portions are parallel with each other, (b) the additional major axes of the first and second portions are non-collinear with each other, (c) each of the additional first, second, and third portions include a node of a transistor selected from the group comprising source, drain, and channel, (e) the additional first, second, and third portions comprise at least one additional finFET; wherein the fin is immediately adjacent the additional fin, the fin and the additional fin are both included in a single system-on-chip (SoC), and the fin and the additional fin are not monolithic with each other.

In example 7 the subject matter of the Examples 1-6 can optionally include wherein the fin is positioned antipodal to the additional fin such that the second portion is immediately adjacent the additional third portion and the third portion is immediately adjacent the additional first portion.

In example 8 the subject matter of the Examples 1-7 can optionally include wherein (a) each of the first, second, and third portions have a maximum width corresponding to its minor axis, and (b) the maximum width of the first portion is unequal to at least one of the maximum widths of the second and third portions.

In example 9 the subject matter of the Examples 1-8 can optionally include wherein the first and second portions each include a channel coupled to a single common gate contact, the channels for the first and second portions not directly contacting each other.

In example 10 the subject matter of the Examples 1-9 can optionally include wherein the first and second portions each include a source coupled to a single common source contact, the sources for the first and second portions not directly contacting each other.

In example 11 the subject matter of the Examples 1-10 can optionally include wherein the major axes of the first, second, and third portions are all non-collinear with each other.

In example 12 the subject matter of the Examples 1-11 can optionally include comprising a system-on-chip (SoC) that includes the at least one finFET and an additional finFET, wherein the additional finFET includes an additional non-planar fin that is not monolithic with the non-planar fin.

In example 13 the subject matter of the Examples 1-12 can optionally include comprising a radio-frequency (RF) mixer that includes the first, second, and third portions.

In example 14 the subject matter of the Examples 1-13 can optionally include wherein the fin includes input nodes for a first signal and an oscillator signal and an output node for a mixed signal based on the first signal and the oscillator signal.

In example 15 the subject matter of the Examples 1-14 can optionally include wherein the first portion includes the input nodes for the first signal and the oscillator signal.

In example 16 the subject matter of the Examples 1-15 can optionally include wherein the second portion includes inputs nodes for an additional signal and an additional oscillator signal.

In example 17 the subject matter of the Example 1-16 can optionally include wherein (a) the non-planar fin includes fourth and fifth portions each having major and minor axes and each being monolithic with the third portion, (b) the major axes of the third, fourth, and fifth portions are parallel with each other, (c) the major axes of the third and fourth portions are non-collinear with each other, (d) the third portion includes an additional input node.

In example 18 the subject matter of the Examples 1-17 can optionally include wherein the third portion is included in an amplifier.

In example 19 the subject matter of the Examples 1-18 can optionally include comprising a multiplexor (mux) that includes the first, second, and third portions.

In example 20 the subject matter of the Examples 1-19 can optionally include wherein (a) the first portion includes an input node for a first signal, (b) the second portion includes an input node for a second signal, (c) the third portion includes an output node for one of the first and second signals, and (d) and each of the first and second portions includes a selection node.

In example 21 the subject matter of Examples 1-20 can optionally include wherein the selection nodes for the first and second portions each couple to a single selection signal source.

In example 22 the subject matter of the Example 21 can optionally include wherein (a) the non-planar fin includes fourth and fifth portions each having major and minor axes and each being monolithic with the third portion, (b) the major axes of the third, fourth, and fifth portions are parallel with each other, (c) the major axes of the third and fourth portions are non-collinear with each other, (d) the third portion includes an additional signal selection node.

Example 23 includes a method comprising: providing a lithography mask, having a first pattern, on a first layer; remove portions of the first layer, based on the first pattern, to form a non-linear backbone in the first layer at a minimum lithographic pitch; providing a spacer layer on a semiconductive layer and sidewalls of the non-linear backbone to form a spacer pattern; removing portions of the semiconductive layer and the backbone based on the spacer pattern to form a non-planar fin having first, second, and third portions each having major and minor axes and each being monolithic with each other; wherein (a) the major axes of the first, second, and third portions are parallel with each other, (b) the major axes of the first and second portions are non-collinear with each other, (c) each of the first, second, and third portions include a node of a transistor selected from the group comprising source, drain, and channel, (e) the first, second, and third portions comprise at least one finFET.

In example 24 the subject matter of the Example 23 can optionally include wherein each of the first, second, and third portions includes a finFET having source, drain, and channel nodes, the fin included in at least three finFETs.

In example 25 the subject matter of Examples 23-24 can optionally include wherein each of the first, second, and third portions includes a node of a single finFET.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a non-planar fin having first, second, and third portions each having major and minor axes and each being monolithic with each other; and
   a system-on-chip (SoC);
   wherein (a) the major axes of the first, second, and third portions are parallel with each other, (b) the major axes of the first and second portions are non-collinear with each other, (c) each of the first, second, and third portions includes a node of a transistor selected from the group comprising source, drain, or channel, (d) the first, second, and third portions comprise at least one finFET;
   wherein the SoC includes the at least one finFET and an additional finFET;
   wherein the additional finFET includes an additional non-planar fin that is not monolithic with the non-planar fin.

2. The apparatus of claim 1, wherein each of the first, second, and third portions includes a finFET having source, drain, and channel nodes, the non-planar fin included in at least three finFETs.

3. The apparatus of claim 1, wherein each of the first, second, and third portions includes a node of a single finFET.

4. The apparatus of claim 3, wherein the first, second, and third portions intersect with each other at a common portion that includes a channel for the single finFET.

5. The apparatus of claim 1 wherein (a) the non-planar fin includes a fourth portion having major and minor axes and being monolithic with the first, second, and third portions, (b) the major axes of the first, second, third, and fourth portions are parallel with each other, (c) the major axis of the fourth portion is non-collinear with at least one of the major axes of the first, second, or third portions.

6. The apparatus of claim 1:
   wherein the additional non-planar fin includes additional first, second, and third portions each having additional major and minor axes and each being monolithic with each other;
   wherein (a) the additional major axes of the additional first, second, and third portions are parallel with each other, (b) the additional major axes of the additional first and second portions are non-collinear with each other, (c) each of the additional first, second, and third portions includes a node of a transistor selected from the group comprising source, drain, or channel;
   wherein the non-planar fin is immediately adjacent the additional non-planar fin, the non-planar fin and the additional non-planar fin are both included in the SoC, and the non-planar fin and the additional non-planar fin are not monolithic with each other.

7. The apparatus of claim 6, wherein the non-planar fin is antipodal to the additional non-planar fin such that the second portion is immediately adjacent the additional third portion and the third portion is immediately adjacent the additional first portion.

8. The apparatus of claim 1, wherein (a) each of the first, second, and third portions has a maximum width corresponding to its minor axis, and (b) the maximum width of the first portion is unequal to at least one of the maximum widths of the second or third portions.

9. The apparatus of claim 1, wherein the first and second portions each include a channel coupled to a single common gate contact, the channels for the first and second portions not directly contacting each other.

10. The apparatus of claim 1, wherein the first and second portions each include a source coupled to a single common source contact, the sources for the first and second portions not directly contacting each other.

11. The apparatus of claim 1, wherein the major axes of the first, second, and third portions are all non-collinear with each other.

12. The apparatus of claim 1 comprising a radio-frequency (RF) mixer that includes the first, second, and third portions.

13. The apparatus of claim 12, wherein the non-planar fin includes input nodes for a first signal and an oscillator signal and an output node for a mixed signal based on the first signal and the oscillator signal.

14. The apparatus of claim 13, wherein the first portion includes the input nodes for the first signal and the oscillator signal.

15. The apparatus of claim 14, wherein the second portion includes inputs nodes for an additional signal and an additional oscillator signal.

16. The apparatus of claim 13 wherein (a) the non-planar fin includes fourth and fifth portions each having major and minor axes and each being monolithic with the third portion, (b) the major axes of the third, fourth, and fifth portions are parallel with each other, (c) the major axes of the third and fourth portions are non-collinear with each other, (d) the third portion includes an additional input node.

17. The apparatus of claim 16, wherein the third portion is included in an amplifier.

18. The apparatus of claim 1 comprising a multiplexor (mux) that includes the first, second, and third portions.

19. The apparatus of claim 18, wherein (a) the first portion includes an input node for a first signal, (b) the second portion includes an input node for a second signal, (c) the third portion includes an output node for one of the first or second signals, and (d) and each of the first and second portions includes a selection node.

20. The apparatus of claim 19 wherein the selection nodes for the first and second portions each couple to a single selection signal source.

21. The apparatus of claim 19, wherein (a) the non-planar fin includes fourth and fifth portions each having major and minor axes and each being monolithic with the third portion, (b) the major axes of the third, fourth, and fifth portions are parallel with each other, (c) the major axes of the third and fourth portions are non-collinear with each other, (d) the third portion includes an additional signal selection node.

22. An apparatus comprising:
a non-planar fin having first, second, and third portions each having major and minor axes and each being monolithic with each other; and
an additional non-planar fin having additional first, second, and third portions each having additional major and minor axes and each being monolithic with each other;
wherein (a) the major axes of the first, second, and third portions are parallel with each other, (b) the major axes of the first and second portions are non-collinear with each other, (c) each of the first, second, and third portions includes a node of a transistor selected from the group comprising source, drain, and channel, (d) the first, second, and third portions comprise at least one finFET;
wherein (a) the additional major axes of the additional first, second, and third portions are parallel with each other, (b) the additional major axes of the additional first and second portions are non-collinear with each other, (c) each of the additional first, second, and third portions includes a node of a transistor selected from the group comprising source, drain, and channel, (d) the additional first, second, and third portions comprise at least one additional finFET;
wherein the non-planar fin is immediately adjacent the additional non-planar fin, the non-planar fin and the additional non-planar fin are both included in a single system-on-chip (SoC), and the non-planar fin and the additional non-planar fin are not monolithic with each other.

* * * * *